(12) United States Patent
Fujita

(10) Patent No.: US 7,068,069 B2
(45) Date of Patent: Jun. 27, 2006

(54) CONTROL CIRCUIT AND RECONFIGURABLE LOGIC BLOCK

(75) Inventor: Shinobu Fujita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 10/943,973

(22) Filed: Sep. 20, 2004

(65) Prior Publication Data

US 2005/0093574 A1    May 5, 2005

(30) Foreign Application Priority Data

Sep. 26, 2003  (JP)  ............................. 2003-335574

(51) Int. Cl.
*H03K 19/173*  (2006.01)
*H03K 19/177*  (2006.01)
*H03K 19/20*   (2006.01)
*G06F 7/38*    (2006.01)
*G11C 8/00*    (2006.01)

(52) U.S. Cl. ............................. 326/38; 326/37; 326/39; 326/46; 326/104; 326/105; 326/106

(58) Field of Classification Search ............. 326/37, 326/38, 39, 46, 104, 105, 106
See application file for complete search history.

(56) References Cited

U.S. PATENT DOCUMENTS

| 5,973,509 | A | * | 10/1999 | Taniguchi et al. ............. 326/81 |
| 6,081,473 | A | * | 6/2000 | Agrawal et al. ........ 365/230.01 |
| 6,191,989 | B1 | * | 2/2001 | Luk et al. .................... 365/207 |
| 6,542,000 | B1 | | 4/2003 | Black et al. |
| 2003/0149833 | A1 | | 8/2003 | Hamlin |

OTHER PUBLICATIONS

Yoshikazu Fujimori, et al., "Development of Nonvolatile Logic with Ferroelectric Capacitors", Technical Report of IEICE, ICD2002-10, Apr. 2002, pp. 13-18 (with English Abstract).

* cited by examiner

*Primary Examiner*—Rexford Barnie
*Assistant Examiner*—Jason Crawford
(74) *Attorney, Agent, or Firm*—Oblon, Spivak, McClelland, Maier & Neustadt, P.C.

(57) ABSTRACT

A control circuit for providing a control signal to build a logic circuit includes a latch circuit including first and second inverted logic gates; a first variable resistive memory provided between an output of the first inverted logic gate and an input of the second inverted logic gate, the first variable resistive memory configured to store a resistance value in accordance with a write signal; and a resistive element provided between an input of the first inverted logic gate, wherein the output of the second inverted logic gate serves to transmit the control signal.

19 Claims, 11 Drawing Sheets

| DSET | DRESET | DSa | DSb | |
|---|---|---|---|---|
| 0 | 0 | 1 | 1 | INITIALIZATION |
| 1 | 1 | 1 | 0 | VRa<VRb |
| 1 | 1 | 0 | 1 | VRa>VRb |

| DSET | DRESET | DSa | DSb | |
|---|---|---|---|---|
| 1 | 1 | 0 | 0 | INITIALIZATION |
| 0 | 0 | 0 | 1 | VRa<VRb |
| 0 | 0 | 1 | 0 | VRa>VRb |

| DSET | DRESET | DSa | DSb | |
|---|---|---|---|---|
| 0 | 0 | 1 | 1 | INITIALIZATION |
| 1 | 0 | 1 | 0 | WRITE VRa<VRb |
| 0 | 1 | 0 | 1 | WRITE VRa>VRb |
| 1 | 1 | 1 | 0 | READOUT VRa<VRb |
| 1 | 1 | 0 | 1 | READOUT VRa>VRb |

CONTROL CIRCUIT AND RECONFIGURABLE LOGIC BLOCK

CROSS REFERENCE TO RELATED APPLICATIONS

This application is based upon and claims the benefit of priority from prior Japanese Patent Application P2003-335574 filed on Sep. 26, 2003; the entire contents of which are incorporated by reference herein.

BACKGROUND OF THE INVENTION

1. Field of the Invention

The present invention relates to a reconfigurable logic block. More specifically, it relates to a control circuit for reading and writing circuitry data for a logic circuit in a memory element.

2. Description of the Related Art

A reconfigurable logic block rewrites a configuration of a logic circuit using software, and is effective as a means of providing an adaptable system large-scale integration (LSI). However, the reconfigurable logic block is large-scale since a memory array, which stores reconfiguration data for a to-be-rewritten logic circuit, is required. Furthermore, when rewriting a logic circuit, it is necessary to serially transmit a large quantity of circuitry data from a memory to a circuit via a bus line. Thus, a great deal of time is required for logic circuit reconfiguration.

In order to solve these problems, it is effective to embed the memory array, which serves to switch over interconnects in the reconfigurable logic block, on the interconnection layer of the reconfigurable logic block.

In other words, since the typical memory array is large-scale, the area of the reconfigurable logic block may be reduced by being fabricated in a multi-level structure. Furthermore, since the interconnect distance between the memory array and the logic circuit may decrease and signals may be transmitted in parallel, the transmission speed of signals for rewriting the interconnects of the logic circuit may increase (Refer to IEICE Tech. Report. ICD2002-10, 2002, p. 13).

In a current method, since writing and reading for the memory array is implemented, for example, in series in units of 16 bits, a great deal of time is required with a large-scale logic circuit. Furthermore, even with rewriting logic circuit interconnects, reconfiguration is implemented in series, requiring a great deal of time.

In the case of transmitting data in parallel between the memory array and the logic circuit, a circuit for writing to and reading from memory elements needs to be miniaturized in order to miniaturize the reconfigurable logic block. Heretofore, a sense amplifier is used for reading circuitry data for the logic circuit. However, the sense amplifier is larger than a memory element. Since each memory element must be provided with a write circuit and a sense amplifier, it is difficult to miniaturize the entire reconfigurable logic block.

The present invention was devised in response to the forgoing requirements, and aims to provide a reconfigurable logic block and a control circuit, so as to miniaturize a write or readout circuit for a memory array, miniaturize the entire circuit by providing a multi-level memory, and decrease logic circuit reconfiguration time.

SUMMARY OF THE INVENTION

A first aspect of the present invention inheres in a control circuit for providing a control signal to build a logic block, including: a latch circuit including a first inverted logic gate and a second inverted logic gate; a first variable resistive memory provided between an output of the first inverted logic gate and an input of the second inverted logic gate, the first variable resistive memory configured to store varying a resistance value in accordance with a write signal; and a resistive element provided between an input of the first inverted logic gate and an output of the second inverted logic gate, the output of the second inverted logic gate serving to transmit the control signal.

A second aspect of the present invention inheres in a reconfigurable logic block, including: an input circuit configured to acquire reconfiguration data of logic gates for building a plurality of logic circuits; a memory array having a plurality of memory units corresponding to a number of the plurality of logic circuits, the memory units including paired first and second variable resistive memories, configured to store the reconfiguration data based on a magnitude relation of resistance between the first and second variable resistive memories in accordance with a write signal corresponding to the reconfiguration data; an inverted logic gate array having a plurality of inverted logic gate units corresponding to the memory units, each of the inverted logic gate units having a latch circuit, which includes a first inverted logic gate and a second inverted logic gate, the inverted logic gate unit connected respectively to the first variable resistive memory between an output of the first inverted logic gate and an input of the second inverted logic gate, and the second variable resistive memory between an input of the first inverted logic gate and an output of the second inverted logic gate, the inverted logic gate units configured to transmit the configuration signal by reading out the reconfiguration data from the memory units; a selection circuit configured to transmit a selection signal for the reconfiguration data to the inverted logic gate array; and a reconfigurable logic gate configured to rebuild the logic gates in accordance with the configuration signal corresponding to the reconfiguration data selected by the selection signal.

DETAILED DESCRIPTION OF THE INVENTION

Figure 1:
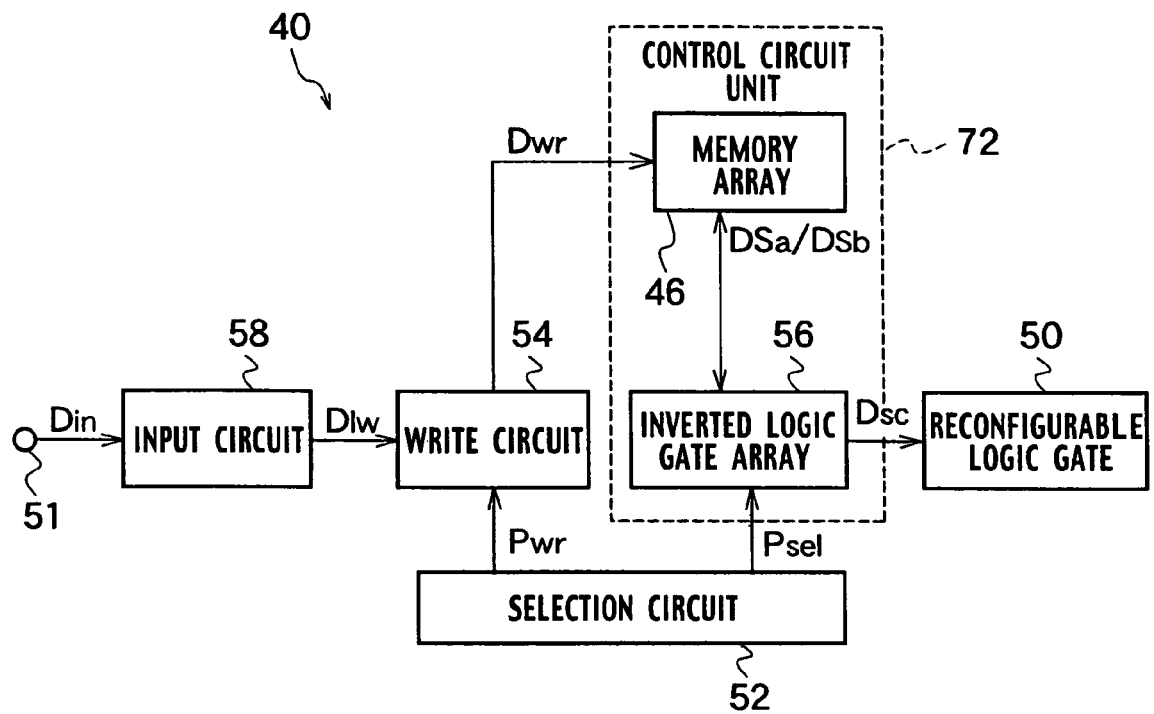
FIG. 1 is a block diagram showing an exemplary reconfigurable logic block according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. It is noted that in the description of the present invention, an "inverted logic gate" is defined as an inverter, a NAND logic gate or a NOR logic gate.

First Embodiment

A reconfigurable logic block 40 according to a first embodiment of the present invention, as shown in FIG. 1, includes an input circuit 58 for acquiring an input signal Din including data used for implementing reconfiguration of logic gates for each of a plurality of logic circuits (hereinafter, referred to as 'reconfiguration data') from an input terminal 51 externally connected to, for example, a design system for a logic circuit layout (not shown in the drawing). A write circuit 54 is provided for transmitting a write signal Dwr corresponding to the reconfiguration data by amplifying and converting a circuitry data signal Dlw transmitted from the input circuit 58. A control circuit unit 72 has a memory array 46 storing the reconfiguration data for the plurality of logic circuits in accordance with the write signal Dwr and an inverted logic gate array 56 implementing logical operations based on the stored reconfiguration data by control signals DSa and DSb. The control circuit unit 72 transmits a configuration signal DSc corresponding to the reconfiguration data stored in the memory array 46. A selection circuit 52 transmits a write instruction signal Pwr to the write circuit 54 for the memory array 46, and transmits a selection signal Psel for the reconfiguration data to the inverted logic gate array 56. A reconfigurable logic gate 50 is provided for rebuilding a logic gate of the logic circuit in accordance with the configuration signal DSc, which is transmitted from the control circuit unit 72, corresponding to the reconfiguration data for the logic circuit selected by the selection signal Psel. Note that the memory array 46 includes a plurality of arranged memory modules corresponding to each of the logic circuits for reconfiguration. Additionally, since each inverted logic gate in the logic circuit array 56 is individually connected to each variable resistive memory in the memory array 46, the inverted logic gate array 56 also includes a plurality of arranged inverted logic gates corresponding to each of the memory modules in the memory array 46. A reconfigurable logic circuit serving a specific operation is provided by connecting a plurality of reconfigurable logic blocks 40.

Figure 2:
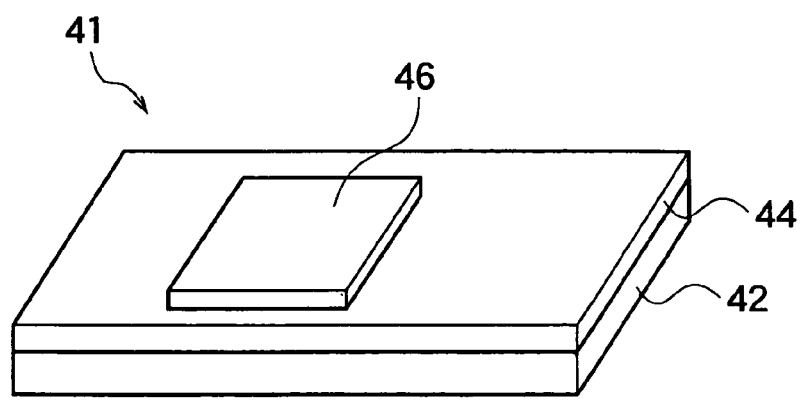
FIG. 2 is a schematic diagram showing an exemplary structure of a semiconductor chip installing the reconfigurable logic block according to the first embodiment of the present invention.

A semiconductor chip 41 in which the reconfigurable logic blocks 40 are installed includes, as shown in FIG. 2, a semiconductor substrate 42 having the input circuit 58, the write circuit 54, the inverted logic gate array 56, the selection circuit 52, the reconfigurable logic gate 50; an interconnection layer 44 provided on the semiconductor substrate 42; and the memory array 46 provided on a surface of the interconnection layer 44. The interconnection layer 44 includes, interconnects for the input circuit 58, the write circuit 54, the inverted logic gate array 56, the selection circuit 52, the reconfigurable logic gate 50 on the semiconductor substrate 42; and interconnects connecting between the inverted logic gate array 56 and the memory array 46 in the control circuit unit 72. FIG. 2 shows an exemplary layout of the memory array 46 located on the surface of the interconnection layer 44. However, the location of the memory array 46 is not limited to the surface of the interconnection layer 44. Alternatively, the memory array 46 may be installed in the interconnection layer 44. As shown, the memory array 46 is provided on the interconnection layer 44, which is arranged on the semiconductor device 42, allowing a miniaturized reconfigurable logic block 40, which is a basic structural element of a reconfigurable logic circuit.

A look-up table (LUT), an arithmetic and logic unit (ALU) or the like is used for the reconfigurable logic gate 50. The LUT or the ALU is provided with a logic gate, or a processing unit or the like by use of a metal-oxide-semiconductor (MOS) transistor or a complementary MOS (CMOS) transistor, and the like.

Figure 3:
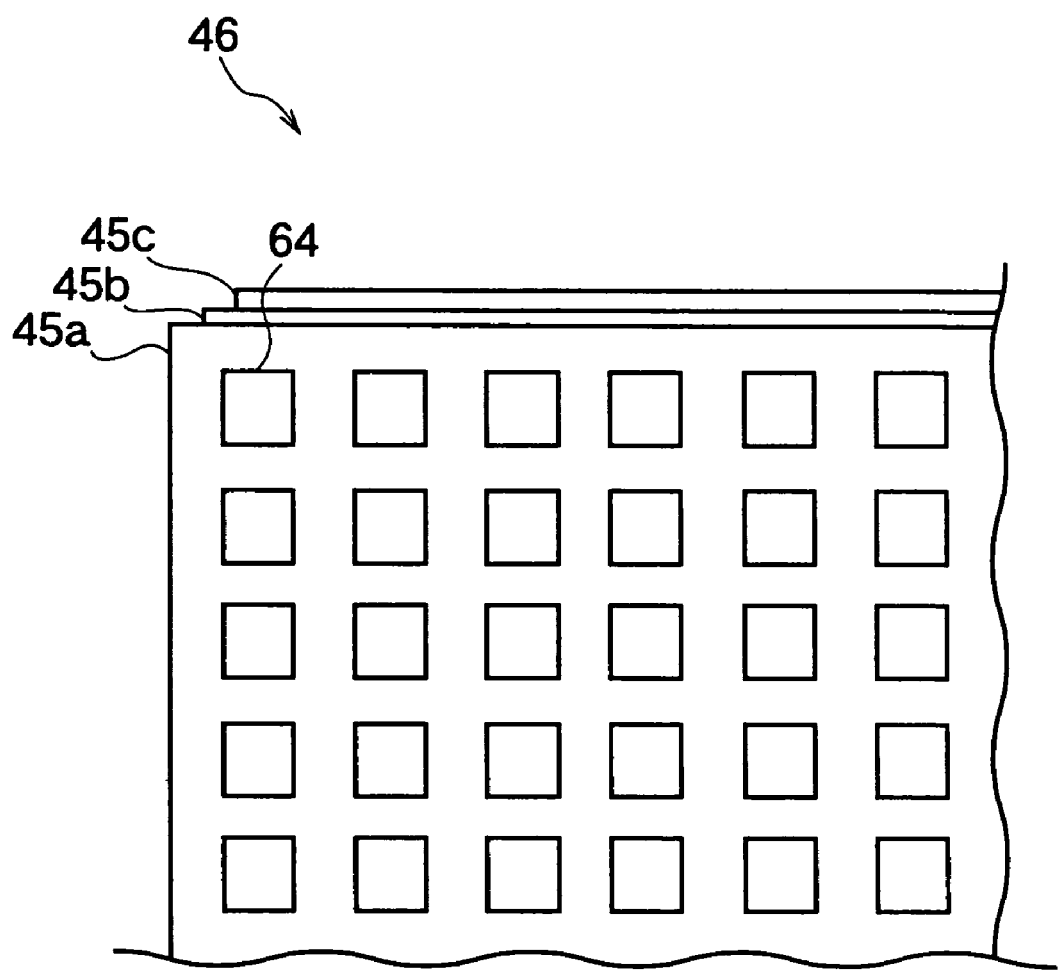
FIG. 3 is a schematic diagram showing an exemplary memory array according to the first embodiment of the present invention.

As shown in FIG. 3, a plurality of memory units 64 corresponding to the reconfiguration data to be used for building the plurality of logic circuits, in the memory modules 45a, 45b, 45c, ... provided in the memory array 46 of the control circuit unit 72, are arranged on the upper portion of the reconfigurable logic gate 50. Each memory unit 64 is connected to the corresponding inverted logic gate array 56.

Figure 4:
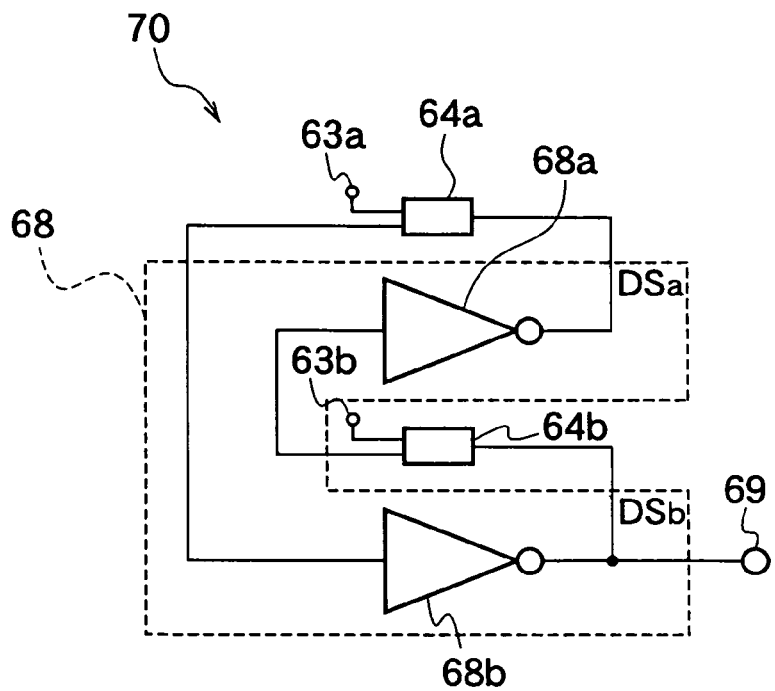
FIG. 4 is a schematic diagram showing an exemplary configuration of a control circuit according to the first embodiment of the present invention.

As shown in FIG. 4, each control circuit 70 provided in the control circuit unit 72 according to the first embodiment includes an inverted logic gate unit 68, which is provided in the inverted logic gate array 56 of FIG. 1, and the memory unit 64 corresponding to the inverted logic gate unit 68, which is provided in the memory array 46. A first inverted logic gate 68a and a second inverted logic gate 68b are provided in the inverted logic gate unit 68, and a first variable resistive memory 64a and a second variable resistive memory 64b are provided in the memory unit 64. The first variable resistive memory 64a is connected to a first interconnect between an output of the first inverted logic gate 68a and an input of the second inverted logic gate 68b. The second variable resistive memory 64b is connected to a second interconnect between an input of the first inverted logic gate 68a and an output of the second inverted logic gate 68b. In other words, the first and second variable resistive memories 64a and 64b are inserted between the input and the output of the first and second inverted logic gates 68a and 68b to provide a latch circuit, respectively.

Accordingly, the control signal DSa of the first inverted logic gate 68a is received by the second inverted logic gate 68b via the first variable resistive memory 64a, and the control signal DSb of the second inverted logic gate 68b is received by the first inverted logic gate 68a via the second variable resistive memory 64b. The first and second variable resistive memories 64a and 64b have write terminals 63a and 63b, respectively, for writing the reconfiguration data of the logic circuit. The first and second variable resistive memories 64a and 64b are respectively connected to the write circuit 54. Furthermore, there is an output terminal 69 of the control circuit 70 provided on the output of the second inverted logic gate 68b. The control circuit 70 transmits '1' or '0' as the control signal DSb based on the reconfiguration data written in the memory unit 64. The first and second inverted logic gates 68a and 68b of the latch circuit are negative logic gates such as NOT circuits (inverters), NAND circuits, and NOR circuits. In the first embodiment, inverters are used for the first and second inverted logic gates 68a and 68b. For the first and second variable resistive memories 64a and 64b, a variable resistive memory such as a magneto-resistive memory which varies resistivity by a magnetic field, a phase transition-type memory which varies resistivity by phase transition of a material due to light or heat, and a memory which varies resistivity by an electrical signal may be used. Accordingly, the write signal Dwr is any one of a magnetic signal, an optical signal, a thermal signal, and an electrical signal corresponding to each memory used for the first and second variable resistive memories 64a and 64b.

Figure 5:
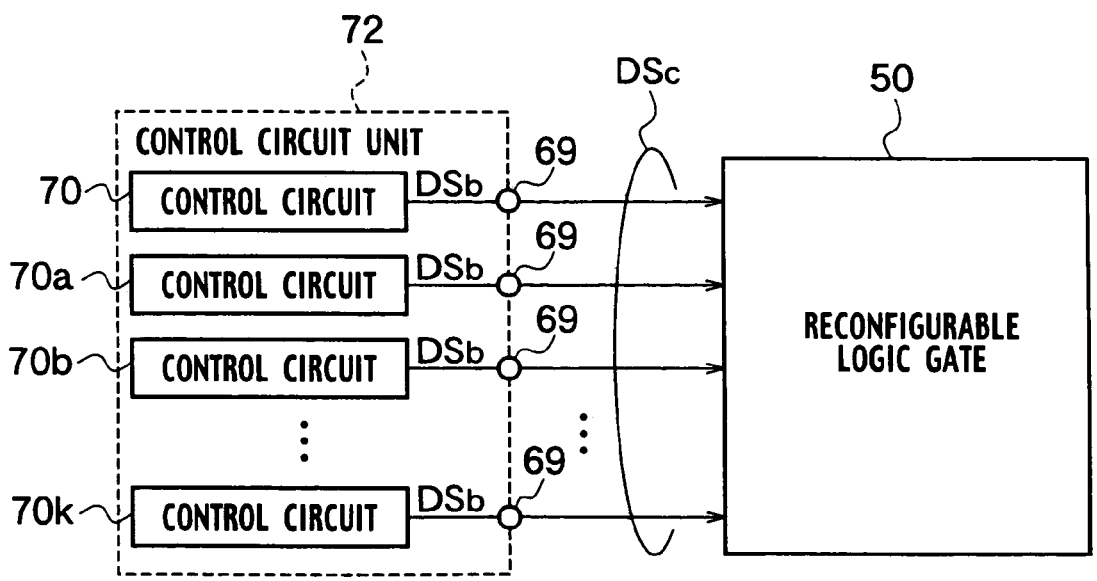
FIG. 5 is a schematic diagram showing an example of control signals from a control circuit unit according to the first embodiment of the present invention.

For the reconfigurable logic gate 50, as shown in FIG. 5, an LUT, an ALU or the like, which is connected to each output terminal 69 of a plurality of control circuits 70, 70a, 70b, . . . , and 70k in the control circuit unit 72, is used. The LUT or the ALU includes a plurality of switching transistors such as MOS transistors, so as to switch over a configuration of logic gates. The configuration of logic gates is determined by a combination of the control signals DSb of the control circuits 70, 70a, 70b, . . . , and 70k. For example, the LUT may build an AND circuit with a specific combination of the control signals DSb, while the LUT may build a NOR circuit with another combination of the control signals DSb.

In the first embodiment, to begin with, the input circuit 58 receives the input signal Din including the reconfiguration data of the logic gates for the plurality of logic circuits from a design system for a logic circuit layout or the like, via the input terminal 51, and the write circuit 54 receives the circuitry data signal Dlw. In the write circuit 54, in accordance with the write instruction signal Pwr from the selection circuit 52, the memory array 46 sequentially receives the write signals Dwr of the reconfiguration data. The write signal Dwr allows the memory units 64 shown in FIG. 3 to be written with the reconfiguration data via the write terminals 63a and 63b of the first and second variable resistive memories 64a and 64b. Thus, the respective reconfiguration data for the reconfigurable logic gates 50 of the plurality of logic circuits are stored in each memory unit 64 in the memory array 46.

The control circuit unit 72 transmits the configuration signals DSc to the reconfigurable logic gates 50 based on the reconfiguration data for the reconfigurable logic gates 50 previously stored in each memory unit 64. For example, respective resistance values VRa and VRb of the first and second variable resistive memories 64a and 64b are assumed to be equivalent because the reconfiguration data is not written into the memory unit 64 of the control circuit 70 shown in FIG. 4. When the power supply for the entire reconfigurable logic block 40 is turned on, both values of the input terminals of the first and second inverted logic gates 68a and 68b are '0' immediately thereafter. As a result, the first and second inverted logic gates 68a and 68b simultaneously begin operations to turn the control signals DSa and DSb to '1'. However, the circuit configurations are symmetrical for the first and second inverted logic gates 68a and 68b. Therefore, whether the first inverted logic gate 68a or the second inverted logic gate 68b is '1' or '0' is not determined.

In the first embodiment, the control circuit 70 has the first and second variable resistive memories 64a and 64b written with different resistance values VRa and VRb, respectively. For example, when the resistance value VRa of the first variable resistive memory 64a is higher than the resistance value VRb of the second variable resistive memory 64b, the transmission speed of the control signal DSa of the first inverted logic gate 68a is lower than that of the control signal DSb of the second inverted logic gate 68b. Therefore, the control signal DSb of the second inverted logic gate 68b reaches the first inverted logic gate 68a before the control signal DSa of the first inverted logic gate 68a reaches the second inverted logic gate 68b. Accordingly, the control signal DSa is always '0' and the control signal DSb is always '1'. To the contrary, when the resistance value VRa of the first variable resistive memory 64a is lower than the resistance value VRb of the second variable resistive memory 64b, the control signal DSa is always '1' and the control signal DSb is always '0'.

By setting the resistance values VRa and VRb of the first and second variable resistive memories 64a and 64b to differ from each other, the control signal DSb of the second inverted logic gate 68b is transmitted from the output terminal 69 of the control circuit 70. The value of the control signal DSb of the control circuit 70 is determined, as described above, according to the magnitude relation of the written resistivities of the first and second variable resistive memories 64a and 64b. In other words, when the second variable resistive memory 64b has a higher resistivity than that of the first variable resistive memory 64a, the control signal DSb of the control circuit 70 is '0'. To the contrary, when the second variable resistive memory 64b has a lower resistivity than that of the first variable resistive memory 64a, the control signal DSb of the control circuit 70 is '1'.

In the control circuit 70 of the inverted logic gate array 56 of the control circuit unit 72, as shown in FIG. 4, the inverted logic gate unit 68 corresponds to the memory unit 64 of the memory array 46. One of the plurality of logic circuits is selected according to the selection signal Psel from the selection circuit 52. The corresponding control circuit 70 reads the stored reconfiguration data from the memory unit 64 provided over each reconfigurable logic gate 50 of the selected logic circuit. The control signal DSb of the control circuit 70, which is the reconfiguration data readout from the memory unit 64, is transmitted to the reconfigurable logic gate 50 from the control circuit unit 72, so as to reconfigure the reconfigurable logic gate 50. Thus, since the corresponding memory unit 64 is provided on the upper portion of each reconfigurable logic gate 50, the interconnect distance for transmitting the reconfiguration data can be decreased. Therefore, the transmission time of the reconfiguration data is decreased.

Figure 6:
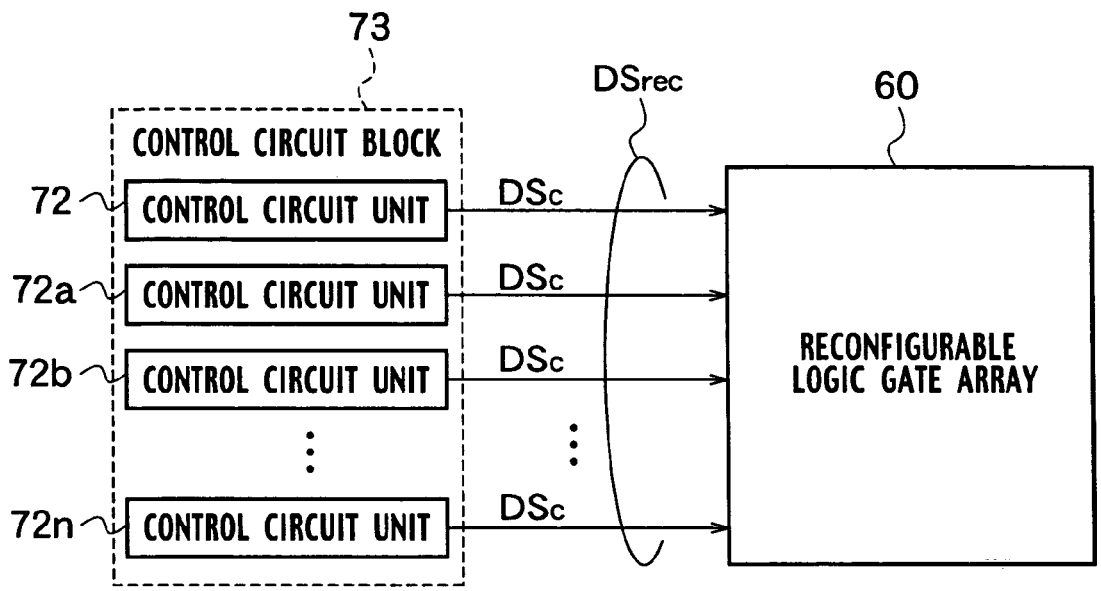
FIG. 6 is a schematic diagram showing an example of configuration signals from a control circuit block according to the first embodiment of the present invention.

In order to achieve a specific logical function by connecting the logic gates, the operation unit, or the like, in the reconfigurable logic gate 50, as shown in FIG. 5, a plurality of control signals DSb are transmitted as a configuration signal DSc to the reconfigurable logic gate 50 from the respective output terminals 69 of the plurality of control circuits 70, 70a, 70b, . . . , and 70k included in the control circuit unit 72. For example, when the 16-bit configuration signal DSc is used to provide the logical function to the reconfigurable logic gate 50, sixteen control circuits 70 to 70k are used in the control circuit unit 72. Additionally, as shown in FIG. 6, a reconfiguration data signal DSrec including a plurality of configuration signals DSc transmitted from the control circuit units 72, 72a, 72b, . . . , and 72n in a control circuit block 73, is transmitted to a reconfigurable logic gate array 60 including a plurality of reconfigurable logic gates 50. The reconfiguration data signal DSrec allows collective and parallel reconfiguration of the interconnects for the logic gates, the operation units, and the like, provided in the reconfigurable logic gates 50, so as to build the selected logic circuit using the reconfigurable logic gate array 60.

In order to implement sequentially reconfiguration and operation for the plurality of logic circuits of which the reconfiguration data are previously stored in the memory array 46, the power supply for the inverted logic gate array 56 in the control circuit unit 72 is reset before transmitting the selection signal Psel from the selection circuit 52. Subsequently, one of the stored reconfiguration data of the logic circuits is newly selected according to the selection signal Psel, and the control circuit 70 corresponding to each of reconfiguration data reads out the reconfiguration data for the selected logic circuit. As a result, the reconfiguration data signal DSrec including the plurality of configuration signals DSc, which are a set of control signals DSb corresponding to each of the reconfiguration data for the reconfigurable logic gates 50, is collectively transmitted to the reconfigurable logic gate array 60 from each of the control circuits 70 included in the control circuit block 73 corresponding to the selected logic circuit.

Thus, according to the first embodiment, since the corresponding memory unit 64 is arranged over the corresponding reconfigurable logic gates 50, the interconnect distance for transmitting reconfiguration data may decrease. Additionally, the reconfiguration data signal DSrec for the reconfigurable logic gate array 60 may be collectively transmitted in parallel. Accordingly, compared to the case where a sense amplifier serially reading out the reconfiguration data is used, the reconfiguration time for a logic circuit may significantly decrease.

Furthermore, the control circuit 70 according to the first embodiment is a latch circuit using the inverters for the first and second inverted logic gates 68a and 68b. The inverter includes two transistors. On the other hand, the current sense amplifier uses at least eight to ten transistors. Accordingly, the control circuit 70 may be miniaturized more than by use of the current sense amplifier. Furthermore, the reconfigurable logic block 40 may also be miniaturized since the memory array 46 is provided over the interconnection layer 44.

Second Embodiment

Figure 7:
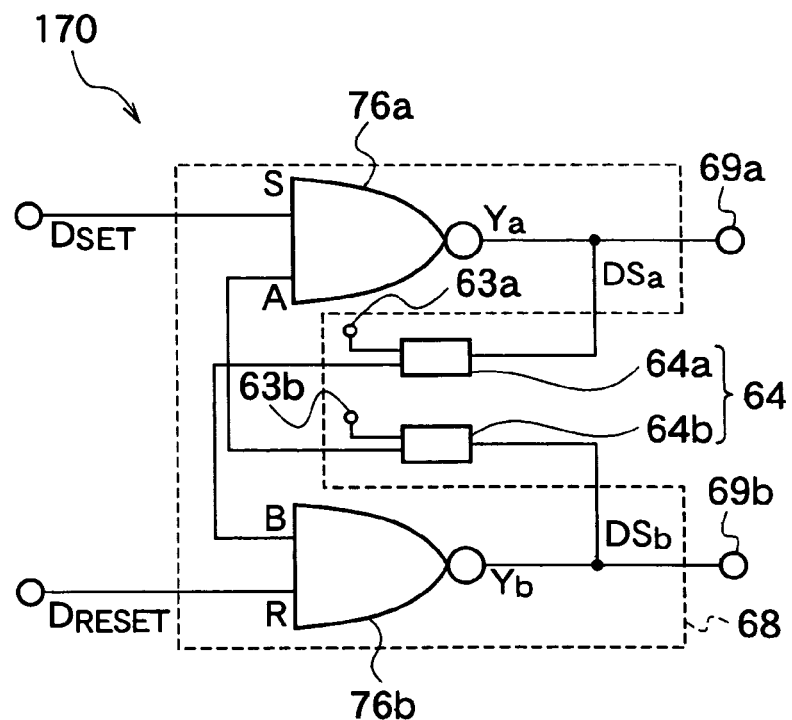
FIG. 7 is a schematic diagram showing an exemplary configuration of a control circuit according to a second embodiment of the present invention.

A control circuit 170 of the reconfigurable logic block 40 according to a second embodiment of the present invention, as shown in FIG. 7, includes an inverted logic gate unit 68 providing a reset-set-latch (RS-latch) circuit, and a memory unit 64 inserted in the inverted logic gate unit 68. A first inverted logic gate 76a and a second inverted logic gate 76b in the inverted logic gate unit 68 include a set input terminal S and a reset input terminal R, respectively. A first variable resistive memory 64a is connected between the output terminal Ya of the first inverted logic gate 76a and an input terminal B of the second inverted logic gate 76b. A second variable resistive memory 64b is connected between an input terminal A of the first inverted logic gate 76a and an output terminal Yb of the second inverted logic gate 76b. Output terminals 69a and 69b of the control circuit 170 are connected to the first and second inverted logic gates 76a and 76b, respectively. NAND circuits are used for the first and second inverted logic gates 76a and 76b. The set input terminal S and the reset input terminal R are connected to the selection circuit 52 shown in FIG. 1, and receive a set input signal $D_{SET}$ and a reset input signal $D_{RESET}$, respectively. Write terminals 63a and 63b are provided to the first and second variable resistive memories 64a and 64b, respectively.

In the second embodiment, the RS-latch circuit used in the control circuit 170 is different from the first embodiment. The rest of the configuration is the same, thus duplicate description is omitted.

Figures 8, 9:
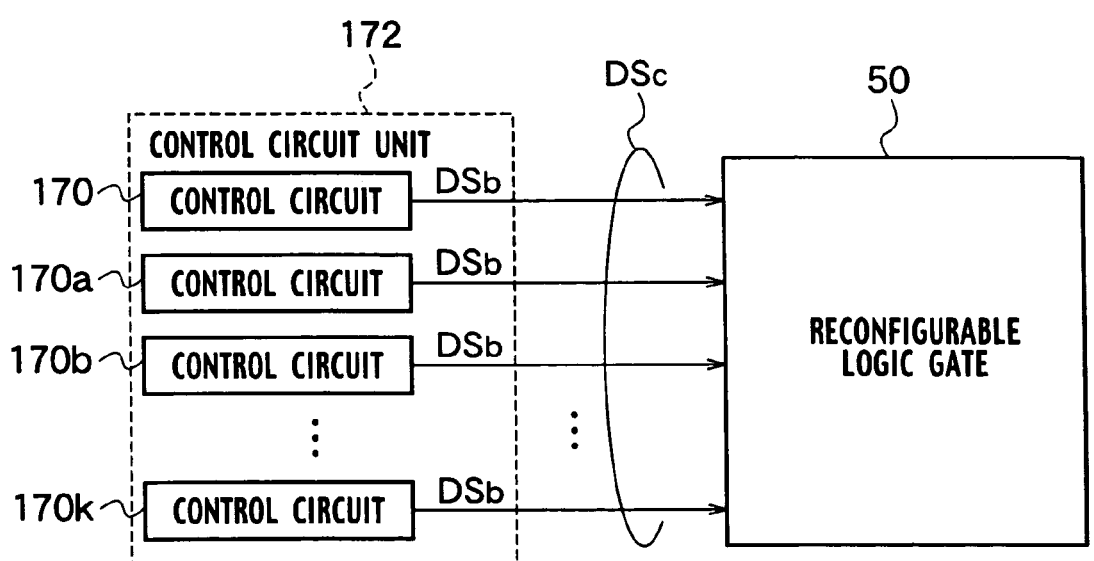
FIG. 8 is an exemplary characteristic table for the control circuit according to the second embodiment of the present invention.
FIG. 9 is a schematic diagram showing an example of control signals from a control circuit unit according to the second embodiment of the present invention.

In the control circuit 170, as shown in the characteristic table of FIG. 8, the set input signal $D_{SET}$ and the reset input signal $D_{RESET}$ transmitted from the selection circuit 52 to the set input terminal S and the reset input terminal R, respectively, are both initialized to '0' in accordance with an initialization signal. As a result, both control signals DSa and DSb of the first and second inverted logic gates 76a and 76b become '1' regardless of the reconfiguration data stored in the memory unit 64. Thereafter, the stored reconfiguration data is read out in accordance with a readout signal from the selection circuit 52, which turns both of the set input signal $D_{SET}$ of the set input terminal S and the reset input signal $D_{RESET}$ of the reset input terminal R, respectively, to '1'. When the set input signal $D_{SET}$ and the reset input signal $D_{RESET}$ are both set to '1', the reconfiguration data can be read out from the memory unit 64, by the same principle as described in the first embodiment, since two NAND circuits operate equivalent to two inverters. Namely, when a resistance value VRa of the first variable resistive memory 64a is lower than a resistance value VRb of the second variable resistive memory 64b, transmission speed of the control signal DSa of the first inverted logic gate 76a is higher than that of the control signal DSb of the second inverted logic gate 76b. Therefore, since the control signal DSa of the first inverted logic gate 76a reaches the input terminal B of the second inverted logic gate 76b before the control signal DSb of the second inverted logic gate 76b reaches the input terminal A of the first inverted logic gate 76a, the control signal DSa is always '1' and the control signal DSb is always '0'. To the contrary, when the resistance value VRa of the first variable resistive memory 64a is higher than the resistance value VRb of the second variable resistive memory 64*b*, the control signal DSa is always '0' and the control signal DSb is always '1'.

The resistance values VRa and VRb of the first and second variable resistive memories 64*a* and 64*b* are set to differ from each other so that, for example, the control signal DSb of the second inverted logic gate 76*b* is the output of the control circuit 170. Namely, the value of the control signal DSb can be determined according to the magnitude relation of the written resistivities of the first and the second variable resistive memories 64*a* and 64*b*. The value of the control signal DSb is '0', when the second variable resistive memory 64*b* has a higher resistivity than that of the first variable resistive memory 64*a*. The value of the control signal DSb is '1' when the first variable resistive memory 64*a* has a higher resistivity than that of the second variable resistive memory 64*b*.

The reconfiguration data for the reconfigurable logic gate 50 is previously stored in the plurality of memory units 64 of the memory array 46 shown in FIG. 3. The control circuit 170 initializes the control signals DSa and DSb and reads out the stored reconfiguration data of the reconfigurable logic gate 50 in accordance with the initialization signal and the readout signal to the set input terminal S and the reset input terminal R from the selection circuit 52. In order to achieve a logical function by connecting the logic gates, the operation unit, and the like of the reconfigurable logic gate 50, as shown in FIG. 9, a plurality of control signals DSb are transmitted as a configuration signal DSc to the reconfigurable logic gates 50 from a plurality of control circuits 170, 170*a*, 170*b*, . . . , and 170*k* included in a control circuit unit 172. For example, in the case of using the 16-bit configuration signal DSc to achieve the logical function of the reconfigurable logic gate 50, sixteen control circuits 170, 170*a*, 170*b*, . . . , and 170*k* in the control circuit unit 172 are used. In addition, a plurality of control circuit units 172 can transmit a plurality of configuration signals DSc corresponding to the reconfiguration data for a plurality of reconfigurable logic gates 50, so as to implement reconfiguration of the logic circuits.

Furthermore, the control circuit 170 according to the second embodiment is provided by the RS-latch circuit using the NAND circuits for the first and second inverted logic gates 76*a* and 76*b*. The NAND circuit typically includes four transistors. Accordingly, the control circuit 170 may be further miniaturized compared with the aforementioned sense amplifier.

In the reconfigurable logic gate 50 according to the second embodiment, it is possible to operate a plurality of logic gates of the logic circuit having different logical functions to implement reconfiguration, without resetting a power supply. For example, the control circuits 170 in the control circuit unit 172 are initialized in accordance with the initialization signal from the selection circuit 52. Any one of the inverted logic gates 68 corresponding to the memory unit 64 in the memory array 46 shown in FIG. 3 is selected according to the selection signal Psel from the selection circuit 52. Next, the readout signal is transmitted to the plurality of control circuits 170 from the selection circuit 52 so as to read out the reconfiguration data. The reconfiguration data are transmitted to the reconfigurable logic gate 50 from the plurality of control circuits 170 so as to implement reconfiguration for a logic circuit having a specific logical function. Thus, by repeating operations of initializing the control circuits 170, selecting the inverted logic gate 68 corresponding to a logic circuit, reading out the reconfiguration data, and implementing reconfiguration of the logic circuit, the plurality of logic circuits with different logical functions can operate reconfiguration in a short cycle. In the second embodiment, since resetting the power of the inverted logic gate array 56 shown in FIG. 1 is not necessary, a power supply control unit can be omitted. Therefore, further miniaturizing of the entire circuit may be possible.

Figures 10, 11:
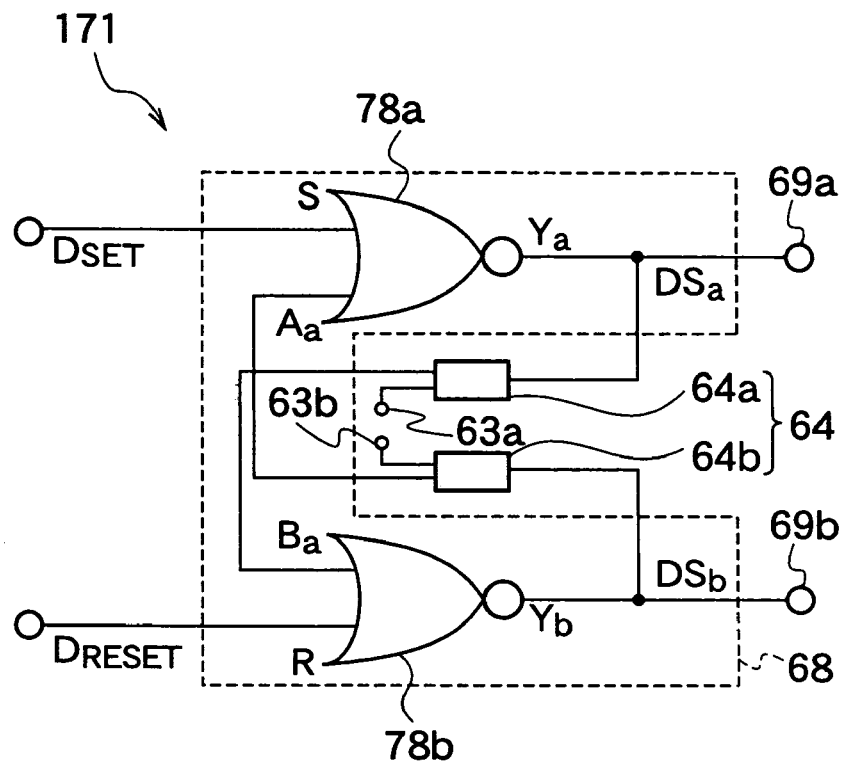
FIG. 10 is a schematic diagram showing another exemplary configuration of the control circuit according to the second embodiment of the present invention.
FIG. 11 is an exemplary characteristic table for another control circuit according to the second embodiment of the present invention.

As described above, in the control circuit 170, the RS-latch circuit is provided by a NAND circuit. However, the RS-latch circuit may be also provided by a NOR circuit. A control circuit 171, as shown in FIG. 10, includes an inverted logic gate unit 68 and a memory unit 64. The inverted logic gate unit 68 includes a first inverted logic gate 78*a* having a set input terminal S and a second inverted logic gate 78*b* having a reset input terminal R. The memory unit 64 includes a first variable resistive memory 64*a* connected between an output terminal Ya of the first inverted logic gate 78*a* and an input terminal Ba of the second inverted logic gate 78*b*, and a second variable resistive memory 64*b* connected between an input terminal Aa of the first inverted logic gate 78*a* and an output terminal Yb of the second inverted logic gate 78*b*. The output terminals 69*a* and 69*b* are connected to the output terminals Ya and Yb of the first and second inverted logic gates 78*a* and 78*b*, respectively. NOR circuits are used for the first and second inverted logic gates 78*a* and 78*b*. The write terminals 63*a* and 63*b* are provided to the first and second variable resistive memories 64*a* and 64*b*, respectively.

In the control circuit 171, as shown in the characteristic table of FIG. 11, the set input signal $D_{SET}$ and the reset input signal $D_{RESET}$ transmitted from the select circuit 52, shown in FIG. 1, to the set input terminal S and the reset input terminal R, respectively, are both initialized to '1' in accordance with an initialization signal. As a result, both of the control signals DSa and DSb of the first and second inverted logic gates 78*a* and 78*b* are '0' regardless of the reconfiguration data stored in the memory unit 64. Thereafter, the stored reconfiguration data is read out in accordance with a readout signal from the selection circuit 52, which turns both the set input signal $D_{SET}$ of the set input terminal S and the reset input signal $D_{RESET}$ of the reset input terminal R, to '10'. If the set input signal $D_{SET}$ and the reset input signal $D_{RESET}$ are both '0', the reconfiguration data is read out from the memory unit 64 by the same principle as described in the first embodiment, since two NOR circuits operate equivalent to two inverters. Namely, when the resistance value VRa of the first variable resistive memory 64*a* is lower than the resistance value VRb of the second variable resistive memory 64*b*, transmission speed of the control signal DSa of the first inverted logic gate 78*a* is higher than that of the control signal DSb of the second inverted logic gate 78*b*. Therefore, since the control signal DSa of the first inverted logic gate 78*a* reaches the input terminal Ba of the second inverted logic gate 78*b* before the control signal DSb of the second inverted logic gate 78*b* reaches the input terminal Aa of the first inverted logic gate 78*a*, the control signal DSa is always '0' and the control signal DSb is always '1'. To the contrary, when the resistance value VRa of the first variable resistive memory 64*a* is higher than the resistance value VRb of the second variable resistive memory 64*b*, the control signal DSa is always '1' and the control signal DSb is always '0'.

As shown in FIGS. 8 and 11, the values of the control signals DSa and DSb are reversed between the control circuit 171 and the control circuit 170. Thus, by use of the control signal DSa of the control circuit 171, it is possible to reconfigure the logic circuit, as with the control circuit 170. Furthermore, the NOR circuit includes four transistors, the same as the NAND circuit. Accordingly, it is possible to further miniaturize the control circuit 171 compared to use of the sense amplifier.

Third Embodiment

Figure 12:
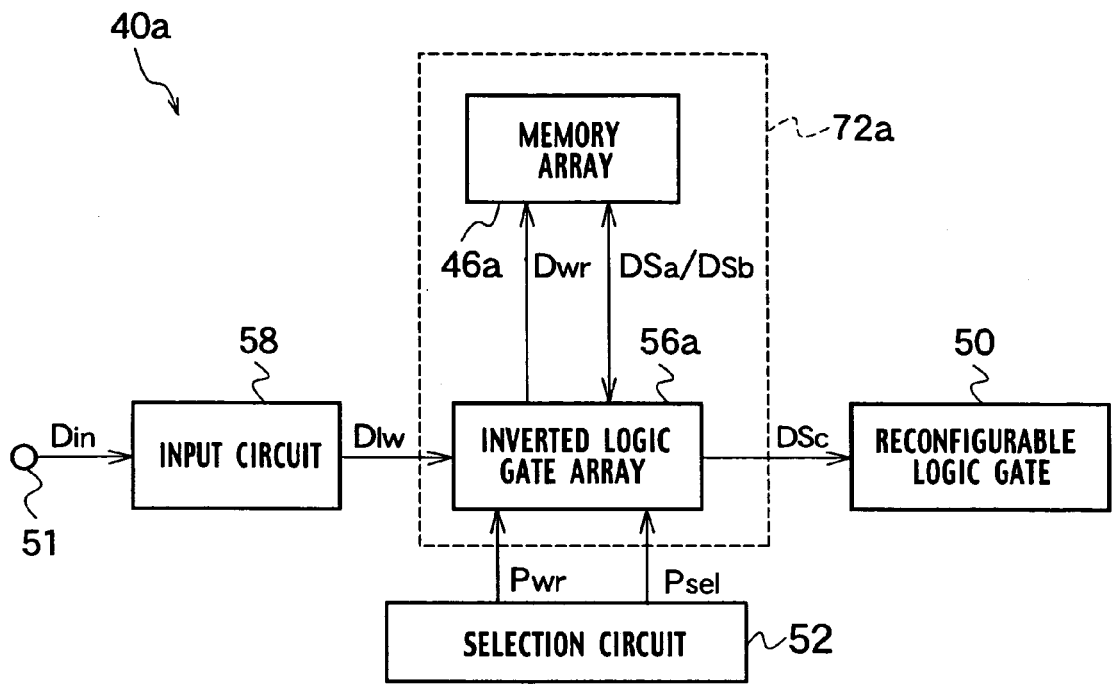
FIG. 12 is a block diagram showing an exemplary reconfigurable logic block according to a third embodiment of the present invention.

A reconfigurable logic block 40a according to a third embodiment of the present invention, as shown in FIG. 12, includes the input circuit 58 having an input terminal 51; a control circuit unit 72a having an inverted logic gate array 56a connected to the input circuit 58, and a memory array 46a connected to the inverted logic gate array 56a; a reconfigurable logic gate 50 connected to the inverted logic gate array 56a; and the selection circuit 52 connected to the inverted logic gate array 56a. The input circuit 58 acquires input signals Din including reconfiguration data of logic gates for a plurality of logic circuits from a design system for a logic circuit layout or the like, which is connected to the input terminal 51. The inverted logic gate array 56a, based on a write instruction signal Pwr from the select circuit 52, transmits a circuitry data signal Dlw from the input circuit 58a as a write signal Dwr to the memory array 46a so as to write in the reconfiguration data. Furthermore, the inverted logic gate array 56a, based on a selection signal Psel from the selection circuit 52, reads out the reconfiguration data stored in the memory array 46a, generating control signals DSa and DSb. Moreover, the inverted logic gate array 56a transmits a configuration signal DSc to the reconfigurable logic gate 50 corresponding to the reconfiguration data of the logic gates for the selected logic circuit. A reconfigurable logic circuit having a specific operation is provided by connecting a plurality of reconfigurable logic blocks 40a.

In the third embodiment, the control circuit unit 72a, which collectively writes and reads out the reconfiguration data, is different from the first and second embodiments of the present invention. The rest of the configuration is the same, thus duplicate description is omitted.

Figure 13:
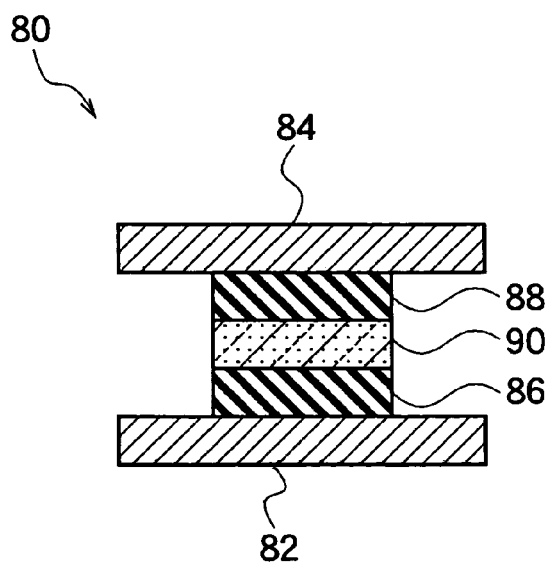
FIG. 13 is a schematic diagram showing an exemplary structure of a variable resistive memory according to the third embodiment of the present invention.

A variable resistive memory 80 provided in the memory array 46a, as shown in FIG. 13, has a first tunnel insulator film 86 and a second tunnel insulator film 88 provided on opposite surfaces of a node 90. The first and second tunnel insulator films 86 and 88 are insulator film of silicon oxide (SiO$_2$) or the like. The node 90 is a semiconductor material such as a silicon (Si) dot. A first and a second electrode 82 and 84 of a conductive material such as a metal are provided on surfaces of the first and second tunnel insulator films 86 and 88, respectively. Film thicknesses of the first and second tunnel insulator films 86 and 88 are in a range of approximately two nm to ten nm. When the film thickness of the first or second tunnel insulator film 86 or 88 is larger than ten nm, a necessary voltage applied between the first and second electrodes 82 and 84 for tunneling injection of electrons into the node 90 may exceed a power-supply voltage for the inverted logic gate array 56a, for example, five V. Thus, writing to the variable resistive memory 80 becomes difficult. Furthermore, when the film thickness of the first or second tunnel insulator film 86 or 88 is less than two nm, the tunneling electrons injected into the node 90 easily leak. Thus, not only a hold time for stored data in the variable resistive memory 80 decreases, but reading out the variable resistive memory 80 becomes difficult. In the third embodiment, the film thicknesses of the first and second tunnel insulator films 86 and 88 are set to approximately three nm.

Figure 14:
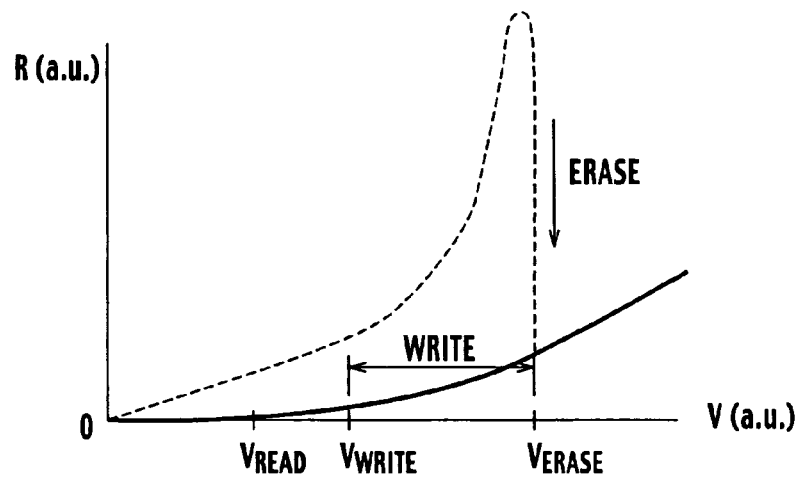
FIG. 14 is a graph showing a voltage versus resistance characteristic for the variable resistive memory according to the third embodiment of the present invention.

The variable resistive memory 80, as shown in FIG. 14, has a voltage versus resistance characteristic indicated by a solid line when electrons have not been injected in the node 90, thereby having low resistance. When an applied voltage between the first and second electrodes 82 and 84 is maintained at a write voltage $V_{WRITE}$ of, for example, 2V, electrons are accumulated in the node 90 by tunneling injection. In a state where the injected electrons are accumulated to charge the node 90, the voltage versus resistance characteristic of the variable resistive memory 80 shows high resistance, as indicated by a dotted line in FIG. 14. When the applied voltage between the first and second electrodes 82 and 84 further increases to an erasure voltage $V_{ERASE}$ of, for example, 3.5V or greater, the electrons in the node 90 can be emitted over potential barriers of the first and second tunnel insulator films 86 and 88. As a result, the accumulated electrons are dispersed to discharge the node 90, and the variable resistive memory 80 returns to the low resistance state. Reading out from the variable resistive memory 80 is implemented by measuring the magnitude of a current flowing through the variable resistive memory 80 with a readout voltage $V_{READ}$ that is lower than the write voltage $V_{WRITE}$. Note that with the readout voltage $V_{READ}$, significant tunneling injection of electrons into the node 90 may not occur and an increase in the resistance of the variable resistive memory 80 maybe less than 1%. Furthermore, in the variable resistive memory 80, since stored data needs to be held during only the time for implementing reconfiguration between a specific logic circuit and anther logic circuit, the hold time for stored data is not necessarily long when frequently implementing reconfiguration.

Figure 15:
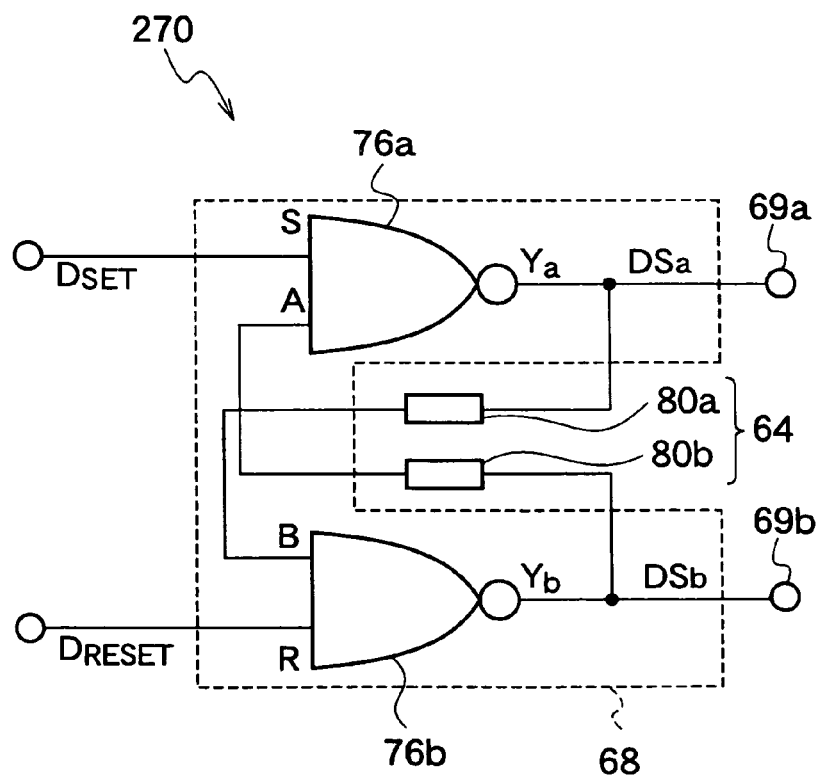
FIG. 15 is a schematic diagram showing an exemplary configuration of a control circuit according to the third embodiment of the present invention.

As shown in FIG. 15, a control circuit 270 of the control circuit unit 72a shown in FIG. 12 includes an inverted logic gate unit 68 providing a RS-latch circuit, and a memory unit 64 inserted in the inverted logic gate unit 68. The inverted logic gate unit 68 includes a first inverted logic gate 76a having a set input terminal S and a second inverted logic gate 76b having a reset input terminal R, respectively. The memory unit 64 includes a first variable resistive memory 80a connected between an output terminal Ya of the first inverted logic gate 76a and an input terminal B of the second inverted logic gate 76b, and a second variable resistive memory 80b connected between an input terminal A of the first inverted logic gate 76a and an output terminal Yb of the second inverted logic gate 76b. Output terminals 69a and 69b are connected to the first and second inverted logic gates 76a and 76b, respectively. NAND circuits are used for the first and second inverted logic gates 76a and 76b. The set input terminal S and the reset input terminal R are connected to the select circuit 52 shown in FIG. 12.

Figures 16, 17:
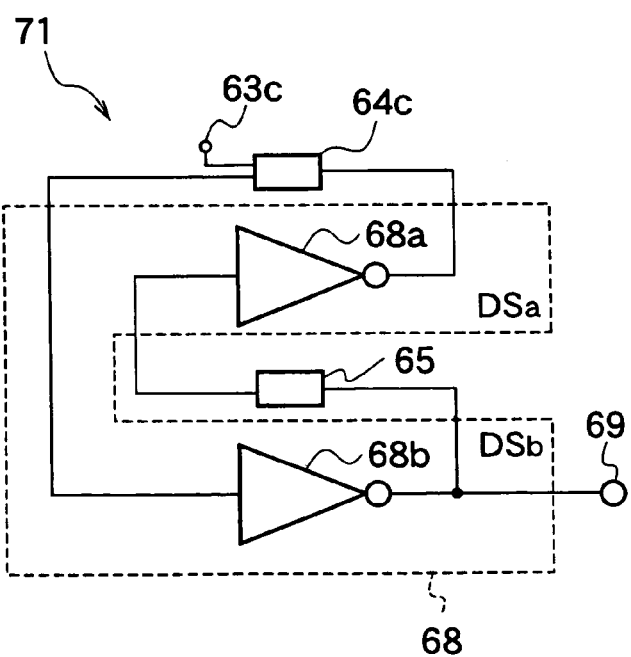
FIG. 16 is an exemplary characteristic table for the control circuit according to the third embodiment of the present invention.
FIG. 17 is a schematic diagram showing an exemplary configuration of a control circuit according to other embodiments of the present invention.

Write and read out of the reconfiguration data implemented by the control circuit 270 is described by referring to the characteristic table of FIG. 16. Note that as with the memory array 46 shown in FIG. 3, a plurality of memory units 64 are provided in the memory array 46a.

In the control circuit 270, to begin with, the power supply voltage for the first and second inverted logic gates 76a and 76b is set to 5V, which is equal to or greater than the erasure voltage $V_{ERASE}$. The set input signal $D_{SET}$ and the reset input signal DRESET transmitted to the set input terminal S and the reset input terminal R, respectively, from the select circuit 52 shown in FIG. 12 are both initialized to '0' in accordance with an initialization signal. Specifically, both of control signals DSa and DSb of the first and second inverted logic gates 76a and 76b become '1' regardless of the reconfiguration data stored in the memory unit 64. As a result, a voltage of 5V is applied to both the first and second variable resistive memories 80a and 80b so as to be initialized to a low resistance. In order to avoid being rewritten, a short pulse voltage is applied for initialization.

Next, when the write instruction signal Pwr is transmitted from the selection circuit 52 to the control circuit 270, the power supply voltage for the first and second inverted logic gates 76a and 76b is set to a voltage of, for example, 3V between the write voltage $V_{WRITE}$ and the erasure voltage $V_{ERASE}$. The inverted logic gate array 56a reads the reconfiguration data from the input circuit 58. The circuitry data signals Dlw corresponding to the reconfiguration data of the logic gates for the plurality of logic circuits are collectively sent from the input circuit 58, to the set input terminals S and the reset input terminals R of the corresponding control circuits 270. Here, the circuitry data signal Dlw is a combination of the set input signal $D_{SET}$ of the set input terminal S and the reset input signal $D_{RESET}$ of the reset input terminal R, ($D_{SET}$, $D_{RESET}$). In the case of a circuitry data signal Dlw (1, 0), the set input terminal S is '1', and the reset input terminal R is '0'. Then, the control signal DSa becomes '1', and the control signal DSb becomes '0'. Since the initial voltage of the input B is 0V, the voltage applied to the first variable resistive memory 80a becomes 3V so as to allow tunneling injection of electrons in the first variable resistive memory 80a. Thus, the first variable resistive memory 80a has high resistance. The second variable resistive memory 80b remains at a low resistance. To the contrary, in the case of the circuitry data signal Dlw (1,0), the control signal DSa becomes '0', and the control signal DSb becomes '1'. Consequently, the first variable resistive memory 80a has a low resistance, and the second variable resistive memory 80b has a high resistance. Thus, the reconfiguration data are collectively written into each memory unit in the memory array 46a.

When reconfiguration data has been written, the power supply voltage for the first and second inverted logic gates 76a and 76b is set to the readout voltage $V_{READ}$ of 1.5 V, for example. At the same time, the selection signal Psel for a desired logic circuit is transmitted to the inverted logic gate array 56a from the selection circuit 52. A readout signal is transmitted from the selection circuit 52 to the control circuit 270 corresponding to the reconfiguration data of the logic gates for the selected logic circuit. According to the readout signal, both of the set input terminal S and the reset input terminal R of the control circuit 270 receive '1'. For example, when the first variable resistive memory 80a is written to have a low resistance, the control signal DSa becomes '1', and the control signal DSb becomes '0'. To the contrary, when the second variable resistive memory 80b is written to have a low resistance, the control signal DSa becomes '0', and the control signal DSb becomes '1'. Accordingly, the control circuit 270 can transmit the reconfiguration data stored in the memory unit 64 to the reconfigurable logic gates 50. In this manner, in accordance with the selection signal Psel and the readout signal from the selection circuit 52, the respective reconfiguration data for the plurality of logic circuits stored in the memory array 46a are transmitted to the reconfigurable logic gates 50 from the control circuits 270 in the inverted logic gate array 56a corresponding to the selected logic circuit.

According to the third embodiment, the reconfigurable logic block 40a may be miniaturized since the memory array 46a may be provided over the interconnection layer as shown in FIG. 2. Additionally, since the control circuit 270, which implements readout of the reconfiguration data of a logic gate and reconfiguration thereof, is an RS-latch circuit, it is possible to miniaturize the reconfigurable logic block 40a. Furthermore, since write and readout of the reconfiguration data are collectively implemented in parallel by the control circuit 270, the time for reconfiguration of a logic circuit may decrease.

Other Embodiments

The present invention has been described as mentioned above. However the descriptions and drawings that constitute a portion of this disclosure should not be perceived as limiting this invention. Various alternative embodiments and operational techniques will become clear to persons skilled in the art from this disclosure.

In the description of the first embodiment, the memory unit 64 including the first and second variable resistive memories 64a and 64b is used for the control circuit 70 shown in FIG. 4. However, a single variable resistive memory may be used. For example, in a control circuit 71, as shown in FIG. 17, a variable resistive variable resistive memory 64c is connected between an output terminal of a first inverted logic gate 68a and an input terminal of a second inverted logic gate 68b, and a fixed reference resistance (a resistive element) 65 is connected between an input terminal of the first inverted logic gate 68a and an output terminal of the second inverted logic gate 68b. In this case, a resistance value Rref of the reference resistance 65 is set between a minimum and a maximum of a variable resistance value VRc of the variable resistive memory 64c. When the resistance value VRc of the variable resistive memory 64c is written over the resistance value Rref of the reference resistance 65, the control signal DSb of the control circuit 70a is '1'. In the reversed case, the control signal DSb is '0'.

Thus, even with the control circuit 71 having the reference resistance 65, it is possible to store reconfiguration data for a logic circuit, and to implement reconfiguration of the logic circuit. The variable resistive memory 64c and the reference resistance 65 may be provided in the memory units 64 shown in FIG. 3. Alternatively, the reference resistance 65 may be fabricated on the semiconductor substrate as with the inverted logic gate unit 68. In this case, the memory unit 64 includes only the variable resistive memory 64c, allowing a smaller area for the memory array. Furthermore, since a write terminal 63c needs to be provided only to the variable resistive memory 64c, interconnects for writing may decrease.

Figure 18:
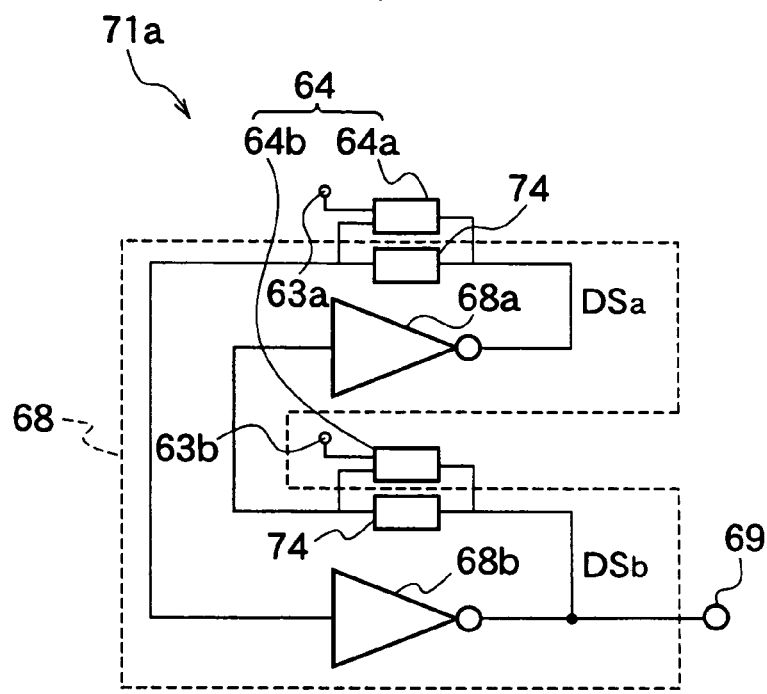
FIG. 18 is a schematic diagram showing another exemplary configuration of a control circuit according to the other embodiments of the present invention.

In addition, in the first embodiment, the first and second variable resistive memories 64a and 64b of the control circuit 70 are serially arranged between the input terminal and the output terminal of the first and second inverted logic gates 68a and 68b, respectively. However, there may be a case where the minimum resistance value of the first and second variable resistive memories 64a and 64b is so high that delays in control signals DSa and DSb increase. For example, when resistances of the interconnects connecting between the input terminal and the output terminal of the first and second inverted logic gates 68a and 68b, respectively, are approximately the same as the minimum resistance value of the first and second variable resistive memories 64a and 64b, as shown in FIG. 18, the first and second variable resistive memories 64a and 64b in a control circuit 71a may be connected in parallel to interconnect portions 74 between the input terminal and the output terminal of the first and second inverted logic gates 68a and 68b, respectively. Since a combined resistance of the minimum resistance value of the first or second variable resistive memories 64a or 64b and the resistance value of the interconnect portion 74 is reduced to approximately ½, the delay for the control signals DSa or DSb can be prevented.

Figure 19:
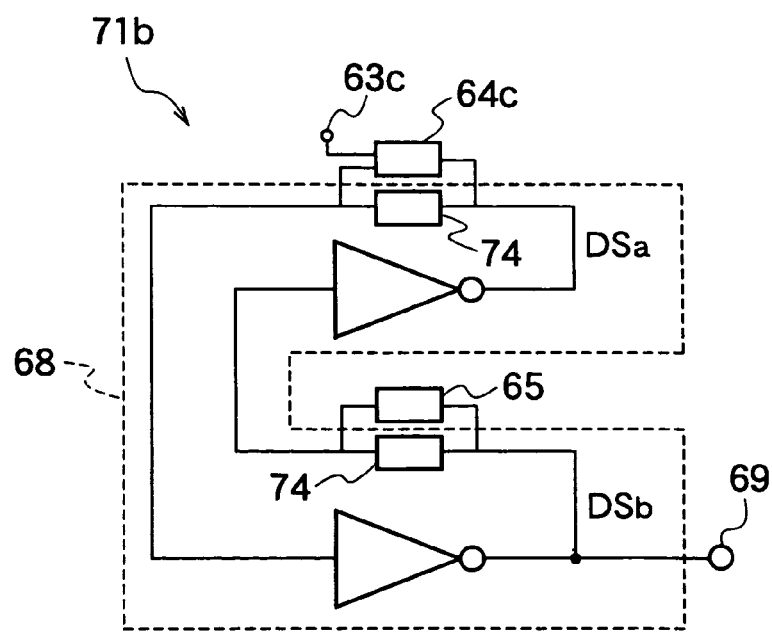
FIG. 19 is a schematic diagram showing another exemplary configuration of a control circuit according to the other embodiments of the present invention.

Furthermore, the case where the minimum resistance value of the variable resistive memory 64c shown in FIG. 17 is high may also use a parallel connection, as in the above description, as long as the resistance of the interconnect connecting between the input terminal and the output terminal of the first and second inverted logic gates 68a and 68b is approximately the same as the minimum resistance value of the variable resistive memory 64c. Namely, in the control circuit 71b, as shown in FIG. 19, delays in control signals DSa and DSb may be prevented by connecting the variable resistive memory 64c and the reference resistance 65 in parallel to the interconnect portions 74.

Figure 20:
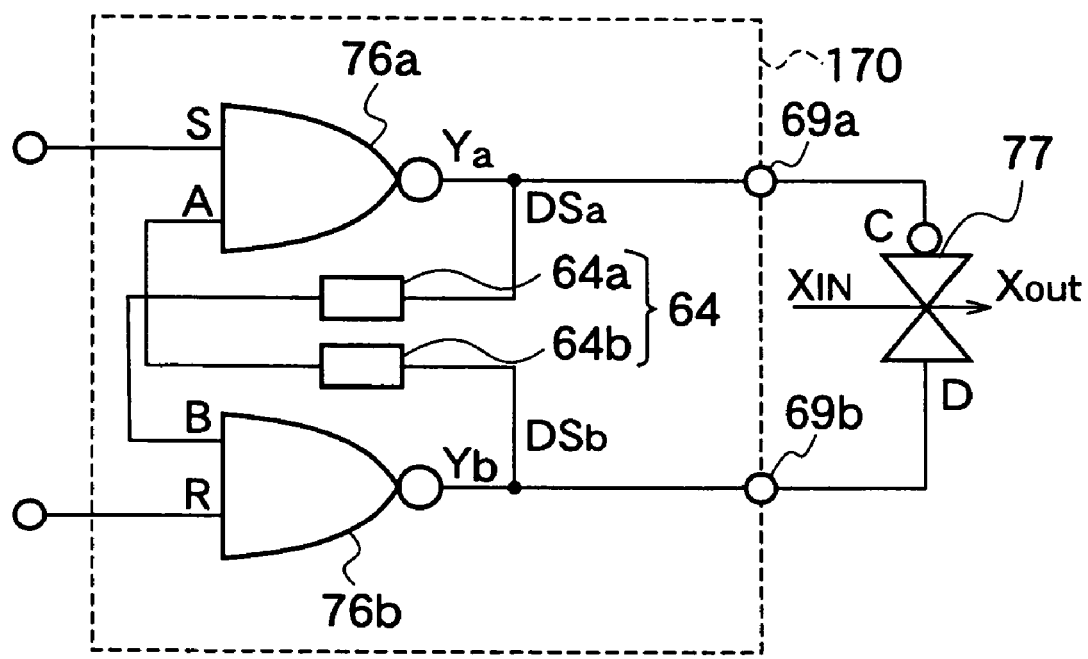
FIG. 20 is a schematic diagram showing another exemplary configuration of a control circuit according to the other embodiments of the present invention.

Furthermore, in the description of the first through third embodiments, reconfiguration of logic gates is implemented by controlling the switching transistors, which are provided in the reconfigurable logic gate 50, using the control signal DSb or DSa of the control circuits 70, 170, 171, and 270. However, a transfer gate may be used for switching interconnects between the logic gates and the operation units. As shown in FIG. 20, output terminals 69a and 69b transmitting the control signals DSa and DSb of the first and second inverted logic gates 76a and 76b in the control circuit 170, respectively, are connected to a negative input terminal C and an input terminal D of a transfer gate 77, respectively. The transfer gate 77 may be provided in the reconfigurable logic gate 50 shown in FIG. 1 or 12. Switching terminals of the transfer gate 77 are connected to interconnects XIN and XOUT, which are used for connection between MOSFETs, logic gates, operation units, and the like.

For example, when the control signals DSa and DSb of the first and second inverted logic gates 76a and 76b are '0' and '1', respectively, the transfer gate 77 turns on to connect the interconnects XIN and XOUT. Furthermore, when the control signals DSa and DSb are '1' and '0', respectively, the transfer gate 77 turns off to disconnect the interconnects XIN and XOUT. Accordingly, the reconfiguration data of the logic gates stored in the memory unit 64 is transferred to the reconfigurable logic gate by the control circuit 170 to implement reconfiguration of the logic gates via the transfer gate 77.

What is claimed is:

1. A control circuit for providing a control signal to build a logic circuit, comprising:
   a latch circuit including a first and a second inverted logic gate;
   a first variable resistive memory provided between an output of the first inverted logic gate and an input of the second inverted logic gate, the first variable resistive memory configured to store a resistance value in accordance with a write signal; and
   a resistive element provided between an input of the first inverted logic gate and an output of the second inverted logic gate,
   wherein the output of the second inverted logic gate serves to transmit the control signal.

2. The control circuit of claim 1, wherein the resistive element is a second variable resistive memory storing another resistance value in accordance with the write signal.

3. The control circuit of claim 1, wherein the resistive element is a reference resistance having a fixed resistance value between a minimum and a maximum in a range of the variable resistance value of the first variable resistive memory.

4. The control circuit of claim 2, wherein the first variable resistive memory is connected to a first interconnect in series, the first interconnect provided between the output of the first inverted logic gate and the input of the second inverted logic gate, and the second variable resistive memory is connected to a second interconnect in series, the second interconnect provided between the input of the first inverted logic gate and the output of the second inverted logic gate.

5. The control circuit of claim 3, wherein the first variable resistive memory is connected to a first interconnect in parallel, the first interconnect provided between the output of the first inverted logic gate and the input of the second inverted logic gate, and the reference resistance is connected to a second interconnect in parallel, the second interconnect provided between the input of the first inverted logic gate and the output of the second inverted logic gate.

6. The control circuit of claim 2, wherein the write signal is one of an electrical signal, a magnetic signal, an optical signal, and a thermal signal.

7. The control circuit of claim 4, wherein the first and second variable resistive memories are provided with first and second tunneling insulator films on opposite surfaces of a semiconductor node.

8. The control circuit of claim 7, wherein resistances of the first and second variable resistive memories decrease by charging the semiconductor node.

9. The control circuit of claim 2, wherein the first and second variable resistive memories are provided on one of an interior and a surface of an interconnection layer, the interconnection layer provided on a semiconductor substrate including the latch circuit.

10. The control circuit of claim 1, wherein the latch circuit is a reset-set-latch circuit.

11. A reconfigurable logic block, comprising:
    an input circuit configured to acquire reconfiguration data of logic gates for building a plurality of logic circuits;
    a memory array having a plurality of memory units corresponding to a number of the plurality of logic circuits, the memory units including paired first and second variable resistive memories, configured to store the reconfiguration data based on a magnitude relation of resistance between the first and second variable resistive memories in accordance with a write signal corresponding to the reconfiguration data;
    an inverted logic gate array having a plurality of inverted logic gate units corresponding to the memory units, each of the inverted logic gate units having a latch circuit, which includes a first inverted logic gate and a second inverted logic gate, the inverted logic gate unit connected respectively to the first variable resistive memory between an output of the first inverted logic gate and an input of the second inverted logic gate, and the second variable resistive memory between an input of the first inverted logic gate and an output of the second inverted logic gate, the inverted logic gate units configured to transmit the configuration signal by reading out the reconfiguration data from the memory units;
    a selection circuit configured to transmit a selection signal for the reconfiguration data to the inverted logic gate array; and
    a reconfigurable logic gate configured to rebuild the logic gates in accordance with the configuration signal corresponding to the reconfiguration data selected by the selection signal.

12. The reconfigurable logic block of claim 11, further comprising a write circuit configured to acquire the reconfiguration data from the input circuit so as to transmit the write signal.

13. The reconfigurable logic block of claim 11, wherein the inverted logic gate array acquires the reconfiguration data from the input circuit so as to transmit the write signal.

14. The reconfigurable logic block of claim 11, wherein the memory array is provided on one of an interior and a surface of an interconnection layer, the interconnection layer provided on a semiconductor substrate including the input circuit, the inverted logic gate array, the selection circuit, and the reconfigurable logic gates.

15. The reconfigurable logic block of claim 11, wherein the write signal is one of an electrical signal, a magnetic signal, an optical signal, and a thermal signal.

16. The reconfigurable logic block of claim 11, wherein each of the inverted logic gate units has a transfer gate connected to the outputs of the first and second inverted logic gates, respectively, the transfer gate configured to transmit the reconfiguration data.

17. The reconfigurable logic block of claim 11, wherein the first and second variable resistive memories are provided with first and second tunneling insulator films on opposite surfaces of a semiconductor node.

18. The reconfigurable logic block of claim 17, wherein resistances of the first and second variable resistive memories decrease by charging the semiconductor node.

19. The reconfigurable logic block of claim 11, wherein the latch circuit is a reset-set-latch circuit.

* * * * *